(12) United States Patent
Sano

(10) Patent No.: US 7,148,948 B2
(45) Date of Patent: Dec. 12, 2006

(54) SCANNING EXPOSURE APPARATUS, AND DEVICE MANUFACTURING METHOD

(75) Inventor: Kazuo Sano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 11/019,106

(22) Filed: Dec. 22, 2004

(65) Prior Publication Data

US 2005/0162628 A1 Jul. 28, 2005

(30) Foreign Application Priority Data

Dec. 26, 2003 (JP) ............................... 2003/434549

(51) Int. Cl.
*G03B 27/52* (2006.01)
*G03B 27/72* (2006.01)

(52) U.S. Cl. ............................. 355/43; 355/55; 355/59; 355/71; 355/77

(58) Field of Classification Search ...................... None
See application file for complete search history.

(56) References Cited

U.S. PATENT DOCUMENTS

| | | | |
|---|---|---|---|
| 4,822,975 A | 4/1989 | Torigoe | 219/121.85 |
| 5,777,724 A | 7/1998 | Suzuki | 355/68 |
| 6,097,474 A * | 8/2000 | McCullough et al. | 355/53 |
| 6,104,474 A | 8/2000 | Suzuki | 355/69 |
| 6,323,937 B1 | 11/2001 | Sano | 355/69 |
| 6,538,723 B1 | 3/2003 | Hagiwara et al. | 355/67 |
| 6,577,381 B1 | 6/2003 | Sano | 355/69 |
| 2002/0196418 A1 | 12/2002 | Hagiwara et al. | 355/67 |

FOREIGN PATENT DOCUMENTS

| | | |
|---|---|---|
| JP | 60-158449 | 8/1985 |
| JP | 62-193125 | 8/1987 |
| JP | 7-66103 | 3/1995 |
| JP | 10-50599 | 2/1998 |
| JP | 2001-244183 | 9/2001 |

OTHER PUBLICATIONS

"O plus E", No. 159, Feb. 1993, pp. 96-99, with English translation.

* cited by examiner

*Primary Examiner*—D. Rutledge
(74) *Attorney, Agent, or Firm*—Fitzpatrick, Cella, Harper & Scinto

(57) ABSTRACT

A scanning exposure apparatus includes an illumination optical system for illuminating a pattern of an original through an opening being conjugate or approximately conjugate with the pattern of the original, and a changing mechanism for changing a width of the opening with respect to a scan direction of the original. The changing mechanism includes a light blocking plat, and a plurality of driving mechanisms for moving the light blocking plate. The plurality of driving mechanisms is provided at different positions with respect to the light blocking plate and also are arranged to be driven by an actuator. At least one of the plurality of driving mechanisms includes a guiding mechanism for allowing a deviation between a position of an object to be driven by the actuator and a position of the light blocking plate, with respect to a direction different from a direction of displacement of the object to be driven.

15 Claims, 12 Drawing Sheets

SCANNING EXPOSURE APPARATUS, AND DEVICE MANUFACTURING METHOD

FIELD OF THE INVENTION AND RELATED ART

This invention relates generally to a scanning exposure apparatus. More particularly, the invention is directed to a scanning exposure apparatus to be used in a lithographic process, for the manufacture of microdevices, such as semiconductor devices (e.g., ICs or LSIs), liquid crystal display devices or thin film magnetic heads, for example.

The manufacture of semiconductor devices, liquid crystal display devices or thin film magnetic heads, for example, uses a projection exposure apparatus in which, in order that a pattern formed on an original, called a mask or a reticle (hereinafter, simply a "mask"), is transferred onto a photosensitive substrate or a glass substrate having a photosensitive material (resist) applied to its surface (hereinafter, this substrate will be referred to simply as a "wafer"), illumination light for sensitizing the resist is projected through the original onto the photosensitive substrate for exposure of the same.

As regards such projection exposure, there are (i) a proximity exposure method in which, while an original and a photosensitive substrate are placed in contact with each other or in proximity to each other, simultaneous exposure is carried out, (ii) a minor projection exposure method in which, through a mirror reflection optical system, an original and a photosensitive substrate are scanned by exposure light of an arcuate shape, and (iii) a step-and-repeat exposure method using a step-and-repeat type reduction projection exposure apparatus (called a ("stepper") in which, while sequentially moving exposure regions on a substrate toward an exposure region of a projection optical system, a reduced image of the original is simultaneously transferred to each exposure region of the substrate.

In an exposure apparatus based on a step-and-repeat method (a simultaneous exposure method), an effective imaging region has a circular shape. Since, however, semiconductor integrated circuits generally have a rectangular shape, originals to be used have a rectangular shape. Thus, in order to secure a largest transfer region in the simultaneous exposure, the region would have a rectangular shape that inscribes a circular imaging region of the projection optical system. Even in a largest transfer region, it would be a square shape having each side of $1/\sqrt{2}$ (square root of 2) of the diameter of the circle.

On the other hand, an exposure method called a slit-scan exposure method or a step-and-scan method (hereinafter, a "slit scan method") has been proposed, according to which an exposure region of a rectangular shape having a size approximately corresponding to the diameter of a circular imaging region of a projection optical system is used, and a mask and a wafer are scanningly and synchronously moved to thereby expand the transfer region.

Such a slit scan type projection exposure apparatus is described in detail in "O plus E", February 1993, pages 96–99. This exposure apparatus has a rectangular exposure region and, with respect to each shot, scanning exposure is carried out by scanning a slit. When the scan exposure of one shot is completed, the wafer is moved stepwise toward the next shot position, and the scan exposure of the next shot is repeated similarly. By repeating the stepwise motion toward a subsequent shot and the exposure of the same, exposure of the whole wafer is carried out.

In such a slit scan method, when a projection optical system having an imaging region of the same size is used, a larger transfer region can be assured, as compared with the step-and-repeat method, in which each transfer region is exposed simultaneously by using a projection lens. Namely, with respect to the scan direction, there is no restriction due to the optical system. Therefore, a size corresponding to the stroke of a scanning stage can be assured. With respect to a direction perpendicular to the scan direction, a transfer region of approximately $\sqrt{2}$ (square root of 2) times can be assured.

In the exposure apparatus for the manufacture of semiconductor devices, enlargement of the transfer region and improvement of the resolving power have been desired to meet production of large-integration chips. Thus, usability of a projection optical system being smaller in size is very effective with respect to the optical performance and the cost, as well. For this reason, the slit scan type exposure method becomes attractive as a main stream of future exposure apparatuses.

FIG. 10 illustrates the structure of a slit scan type projection exposure apparatus, as disclosed in Japanese Laid-Open Patent Application, Publication No. 10-50599. In FIG. 10, illumination light emitted from a light source 1 is collected by an elliptical condensing mirror 2 and, after this, by means of optical integrators 9 and 14 (14a, 14b), superposition (averaging) of the image plane illuminance is carried out. After passing through a relay lens 42, the light is projected on a movable blind (movable field stop) 32 having two movable blades. The movable blind 32 serves as a Fourier transform plane of the optical integrator 14, and it is placed at a position optically conjugate with a mask 32. Adjacent to it is a fixed blind (field stop) 34. The fixed blind 34 comprises a mechanical field stop having four knife edges, for example, that surround a rectangular opening. By means of the shape of this rectangular opening, the shape of an illumination region upon the mask 23 is determined. Namely, the illumination light, as being restricted by the movable blind 32 and the fixed blind 34, and transmitted by way of a second relay lens 35, a condenser lens 36 and a mirror 11, illuminates the illumination region on the mask 23 with a uniform illuminance distribution. Under the illumination condition described above and after the mask 23 and a wafer 25 are brought into alignment with each other by use of alignment mark 28, the mask 23 and the wafer 25 are synchronously scanned in a first direction (hereinafter "scan direction") along the wafer 25 surface. By this, a photoresist applied to the wafer 25 surface is sensitized and the pattern formed on the mask 23 is transferred on the wafer 25 precisely.

In the slit scan type projection exposure apparatus, each exposure region on the wafer 25 is exposed by scan exposure based on a rectangular opening, which is shorter than the length of these scan regions in the scan direction. Therefore, the integrated exposure amount in each exposure region should be controlled to assure that the integrated exposure amount of the rectangular opening becomes even for all the positions on the wafer 25. If the integrated exposure amount is different depending on the position of the wafer 25, it results in unevenness of an integrated exposure amount inside each exposure region. This causes an error-like illuminance non-uniformness in a step-and-repeat type exposure region. As a solution for illuminance non-uniformness in a slit scan type exposure apparatus, particularly, in a constant-velocity exposure apparatus, Japanese Laid-Open Patent Applications, Publication No. 60-158449 and No. 7-66103, show the provision of a trapezoidal illuminance distribution in a scan direction, in an attempt to make uniform the exposure amount on a wafer. According to this proposal, the change in illuminance with time during exposure, at an arbitrary single point inside an exposure region of a rectangular shape, on a wafer 25, will have a trapezoidal shape, such as shown in FIG. 6A. This means that, in the constant-velocity scanning exposure, since the time base can be directly converted into the space base, a similar illuminance distribution is obtained with respect to the space base, as shown in FIG. 6B.

In the exposure amount control of constant-velocity scan exposure, the illuminance distribution of a trapezoidal shape is regarded as being a rectangular shape having the same height and the same area. More specifically, in FIG. 6B, the trapezoidal illuminance distribution is approximated to a rectangular shape that has a width L of a line connecting the points where the triangular portions outside the rectangle having a width L and a height I, and the triangular portions inside the rectangle have the same area, that is, a line that connects the points, in the slants at the opposite sides, of the level corresponding to a half of the maximum illuminance I, the rectangular shape having the same height as that of the trapezoidal shape. The width L of this rectangle is taken as the slit width.

The prior art described above is an example concerning exclusively the correction of illuminance non-uniformness with respect to the scan direction. The shape of the opening of the fixed blind 34 is still rectangular, and the width of the opening in the scan direction has a constant value. Since the opening of the fixed blind 34 is rectangular, the shape of the opening projected on the mask 23 and the wafer 25 is, as a matter of course, rectangular. Therefore, unless the illuminance in a direction (hereinafter, "slit direction") perpendicular to the scan direction, as well, is even, it results in non-uniformness of exposure.

As described hereinbefore, the movable blind 32 is disposed at a position optically conjugate with the mask 23, and the fixed blind 34 is disposed adjacent to the movable blind 32. However, at the fixed blind 34 position, a uniform illuminance distribution is not always provided within the illumination range. Namely, due to a change in optical path length, for example, resulting from an error in the manufacture of optical elements disposed along the light path from the light source 1 to the fixed blind 34 or from an error in the assembling of them, generally, at the fixed blind 34 position, there is little non-uniformness of illuminance along the plane orthogonal to the optical axis.

Therefore, when the illumination region is restricted into a rectangular shape, by means of the fixed blind 34, to illuminate the mask 32, the wafer 25 is illuminated through the projection lens 22, and it results in dispersion of an integrated exposure amount in dependence upon the exposure position. Thus, uniform exposure is unattainable, and the resist applied to the wafer 25 is sensitized non-uniformly in dependence upon the location. Furthermore, even if the optical system is adjusted so as to remove illuminance non-uniformness completely at the position of the fixed blind 34, since the projection lens 22 for imaging the mask 23 upon the wafer 25 comprises ten or tens of optical elements, due to a production error of these optical elements, or non-uniformness of a coating applied to these optical elements, the transmittance of the illumination light would involve partial non-uniformness.

FIG. 2A shows a distribution of illuminance i(x) of illumination light with respect to the scan direction, upon the mask 23. Even if the illuminance distribution is even as illustrated, due to the non-uniformness of transmittance of the projection lens 22 as described above, the illuminance I(x) upon the wafer 25 would practically have an uneven distribution, such as shown in FIG. 2B.

The non-uniformness of transmittance produced at the projection lens 22 will be explained in more detail. FIG. 8A illustrates an effective region of a projection lens 22, upon a wafer 25. Generally, the projection lens 22 is constituted by a combination of optical elements having a circular outer peripheral shape. Thus, the lens itself has a circular effective portion 81. As described hereinbefore, in the slit scan type exposure apparatus, in order to perform the scan exposure with a wide width, a rectangular exposure region 82 inside the lens effective portion 81 is used. Here, generally, the non-uniformness of illuminance resulting from a manufacturing error of the optical elements, non-uniformness of the coating applied to the optical elements, or an error in the assembling, is produced in a distribution having a correlation with respect to the radial direction of the optical elements. Hence, the illuminance distribution within the rectangular exposure region has a shape as a portion of a spindle shape, as shown in FIG. 9. If the mask 23 and the wafer 25 are synchronously scanned by use of exposure light having such an illumination distribution, the result is that the integrated exposure amount in the scan direction contains large illuminance non-uniformness in dependence upon the location.

As a measure for such inconveniences, Japanese Laid-Open Patent Application, Publication No. 62-193125, proposes a projection exposure apparatus in which a liquid crystal shutter is inserted into the light path of illumination light, thereby to control the irradiation area of exposure light as desired. For those positions wherein the exposure light has a low intensity and the integrated exposure amount is insufficient, the width of the opening in the scan direction is enlarged, while on the other hand, for those positions where the exposure light has a large intensity and the integrated exposure amount is excessive, the width of the opening in the scan direction is narrowed. Although this document describes the function and structure for changing the opening width, it does not refer to the manner of how to determine the opening width to attain efficient projection exposure.

For example, when the photosensitivity (speed) of a resist (photosensitive material) applied to a wafer 25 is Pr, the exposure amount per unit time to be applied to the wafer 25 surface is Qw, the width of the opening of the fixed blind 34 in the scan direction as projected on the wafer 25 is Lw, and the movement velocity of the wafer 25 in the scan direction Vw, since the integrated exposure amount upon the wafer 25 is equivalent to the resist photosensitivity and it follows that:

$$Pr=(Qw \times Lw)/Vw \quad (1)$$

it can be rewritten as:

$$Vw=((Qw \times Lw)/Pr \quad (2)$$

Thus, if the resist photosensitivity Pr is 2,000 J/m$^2$, the exposure amount per unit applied to the wafer 25 surface (hereinafter, "wafer surface illuminance) Qw is 30,000 W/m$^2$, the opening width Lw in the scan direction is 10 mm, then the scan speed of Vw of the wafer 25 is 0.15 m/sec. If, however, the output of the light source 1 is lowered and the wafer surface illuminance Qw decreases to 20,000 W/m$^2$, the scan speed Vw is lowered to 0.10 μm/sec. This means that the time required for exposure is prolonged and that the productivity is lowered.

Here, from equation (2), the scan speed can be made higher by enlarging the opening width Lw in the scan direction. On the other hand, the projection lens 22 has a predetermined effective view angle with which best optical performance is attainable. Therefore, the opening width cannot be expanded as desired. It is seen from the above that, in the structure proposed by this patent document, even for local adjustment of the opening width in the scan direction to meet illuminance non-uniformness, it is necessary to determine how to set the opening width to assure efficient exposure.

Japanese Laid-Open Patent Application, Publication No. 2001-244138, proposes (as first and second inventions), a measure for the inconveniences described above, and it discloses a structure that enables local adjustment for reducing and removing illuminance non-uniformness to be produced on a wafer, while effectively utilizing the view angle of a projection lens. Also, this document shows (as second and third inventions) a structure that enables adjustment for reducing and removing non-uniformness of illuminance, with respect to different exposure conditions to be used in the exposure apparatus.

More specifically, Japanese Laid-Open Patent Application, Publication No. 2001-244183, proposes an adjusting mechanism (FIGS. 1 and 5) having a light blocking plate 66 (66a, 66b) mounted with a tilt with respect to the optical axis of illumination light for removing local unevenness of exposure light applied to a wafer 25. The light blocking plate 66 is provided in the form of a pair (66a, 66b) at positions opposed to each other with respect to the optical axis, and they can be deformed in response to push and pull of push rods 51a, 51b, 51c, 51d, and 51e. By changing the shape of the light blocking plat 66 as desired, the shape of an opening area 60 for the illumination light is determined.

Referring to FIG. 5, details of an adjusting blind 33 will be described. the light blocking plate 66 is a metal plate having a thickness of 0.1 mm, and the surface thereof provides a diffusion surface processed by chemical etching. As shown in FIG. 5, the light blocking plate 66 is disposed with a tilt of about forty degrees with respect to the optical axis of the illumination light. This angle is determined, because, in the embodiments of Japanese Laid-Open Patent Application, Publication No. 2001-244183, a third relay lens 42 has a numerical aperture (NA) of about 0.35 and the illumination light has a divergent angle of about nineteen degrees with respect to the optical axis. The angle is determined to be a sharper angle as compared with the divergence angle of the third relay lens 42 to ensure that, when the light blocking plat 66 is inserted just before the illumination light is focused on the movable blind 32 surface, thereby to make narrow the opening width, the opening width is determined by the optical-axis side edge of the light blocking plate 66.

FIG. 1 illustrates the state of deformation of the light blocking plate 66. In this example, in accordance with normal illuminance non-uniformness upon the wafer 25, the shape of the opening of the adjusting blind 33 is preset to a shape slightly different from a rectangle. While details of the opening shape will be explained later, the opening shape 60 of this example has a pot-like shape, as shown in FIG. 1, and the light blocking plate 66 is adjusted by the push rods 51a–51e in accordance with this opening shape 60. However, when the optical-axis side edge of the light blocking plate 66 is straight, and if the light blocking plate 66 is deformed by the push rods 51a–51e to meet this, since the light blocking plate 66 is disposed with a tilt with respect to the optical axis, the portion thereof to which deforming forces are applied would be deformed not only within the plane of the adjusting blind 33, but also along the optical axis direction. This inevitably produces a change of defocus amount with respect to the movable blind 32, which is at a position optically conjugate with the mask 23.

Even if the defocus amount changes as described, however, regarding the illuminance distribution on the wafer 25, the result would be a mere change of the angle of the slant portions of the trapezoid shown in FIG. 6A. Since the area of the trapezoid is unchanged, there is not a change in the integrated illuminance. However, since the light blocking plate 66 has deformed in the optical axis direction as well, it becomes necessary to enlarge the spacing $\Delta d$ between the movable blind 32 and the light blocking plates 66a and 66b of the adjusting blind 33.

In order to avoid this, the light blocking plate 66 of Japanese Laid-Open Patent Application, Publication No. 2001-244183, is formed with an elliptical edge shape as shown in FIG. 1. Thus, when the opening is deformed into a pot-like shape 60 as described, the edge of the light blocking plate 66 can be placed within the plane perpendicular to the optical axis.

Of course, the opening shape 60 of the adjusting blind 33 is not used only in the normal state. However, since the amount of change of illuminance non-uniformness to be produced on the wafer 25 is only about 1% to 3% due to the change of illumination condition or changes of optical elements with time, the amount of deformation of the light blocking plate 66 is not large.

Japanese Laid-Open Patent Application, Publication No. 2001-2444183, proposes a first invention that concerns a projection exposure apparatus for transferring a pattern of an original onto a photosensitive substrate by synchronously scanning the original and the photosensitive substrate in a first direction, wherein there is exposure region shaping means for locally changing, with respect to a second direction perpendicular to the first direction, an opening width of an exposure region with respect to the first direction, the exposure region shaping means providing an adjusting function for shaping the exposure region into a desired shape to thereby remove local unevenness of an exposure light quantity to be applied to the photosensitive substrate, and wherein a largest opening width with respect to the first direction of the exposure region shaping means corresponds to a largest view angle of a projection lens with respect to the first direction.

With this arrangement, the opening width can be adjusted in accordance with local illuminance non-uniformness to be produced by an illumination optical system for producing illumination light and by the projection lens, such that a uniform exposure distribution can be provided. Additionally, in the opening width adjustment, the largest opening width is made to be equivalent to the largest view angle of the projection lens, by which a largest exposure amount is obtainable with the projection lens.

As a result, the scan speed for synchronous scan exposure of the original and the photosensitive substrate can be a highest speed with respect to the projection lens, and the productivity of the exposure apparatus can be improved.

Japanese Laid-Open Patent Application, Publication No. 2001-244183, proposes a second invention in relation to the first invention, in which the amount of illumination light on the same plane as that of the photosensitive substrate, and with respect to the slit direction, is measured at different positions, and the exposure region shaping means is actuated so that the measured illumination light quantity becomes approximately even, and non-uniformness is removed. Since the illuminance non-uniformness at a position where a resist (photosensitive material) is to be present in the exposure can be measured, factors contributing to the illuminance non-uniformness can be avoided.

Japanese Laid-Open Patent Application, Publication No. 2001-244183, proposes a third invention in relation to the first invention, in which an exposure light amount is locally adjusted every time the illumination condition to the original is changed. Even if optical elements in the light path are changed when the illumination condition for the original is changed, or there occurs illuminance non-uniformness when the portion of the optical elements in the light path to be used is changed, the correction of illuminance non-uniformness can be carried out again. Thus, a uniform exposure distribution is obtainable, constantly.

Japanese Laid-Open Patent Application, Publication No. 2001-244183, proposes a fourth invention in relation to the third invention, in which the step of changing the illumination condition includes a step of measuring the illuminance distribution on the surface of the photosensitive substrate. Thus, the illumination condition change and the illuminance non-uniformness detection can be done uninterruptedly, in series. Inadvertent omission of measurement, for example, by an operator, can be prevented.

Although these examples refer to locally changing the opening width of a slit in the scan direction, there is no specific disclosure in regard to the structure that enables the adjustment. Furthermore, when the amount of change of 1% to 3% of the illuminance non-uniformness is going to be corrected by flexure of the slit made by a thin metal plate, if it is pushed or pulled simply in the scan direction, excessive stress is applied to the mechanism and the load to the actuator becomes excessively large. There is a risk of plastic deformation of the thin metal plate. It is, therefore, necessary to prepare means for easily deforming the variable plate, made of a thin metal plate, in its thickness direction. Furthermore, it would be necessary to choose a catadioptric system having a plurality of mirrors and lenses, as a projection optical system, form the standpoint of energy efficiency, chromatic aberration, and environment sensitivity, to meet a scanning projection exposure apparatus having an arcuate-shape slit opening.

However, in a plane adjacent to the edge of the slit and being conjugate with the mask, there is a blind mechanism for restricting the irradiation region on the mask. Therefore, the exposure non-uniformness adjusting mechanism and the blind mechanism will interfere with each other.

SUMMARY OF THE INVENTION

It is accordingly an object of the present invention to provide an improved apparatus by which at least one of the inconveniences described above can be reduced or removed.

It is another object of the present invention to provide an arrangement by which the width of an opening can be adjusted without excessive stress being applied to a changing mechanism for changing the opening width.

In accordance with an aspect of the present invention, to achieve these objects, there is provided a scanning exposure apparatus, comprising an illumination optical system for illuminating a pattern of an original through an opening being conjugate or approximately conjugate with the pattern of the original, and a changing mechanism for changing a width of the opening with respect to a scan direction of the original, the changing mechanism including a light blocking plate, and a plurality of driving mechanisms for moving the light blocking plate, the plurality of driving mechanisms being provided at different positions with respect to the light blocking plate and also being arranged to be driven by an actuator, wherein at least one of the plurality of driving mechanisms includes a guiding mechanism for allowing a deviation between a position of an object to be driven by the actuator and a position of the light blocking plate, with respect to a direction different from a direction of displacement of the object to be driven.

Briefly, in accordance with the present invention, the opening width can be adjusted without causing excessive stress to the opening-width changing mechanism.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 7:
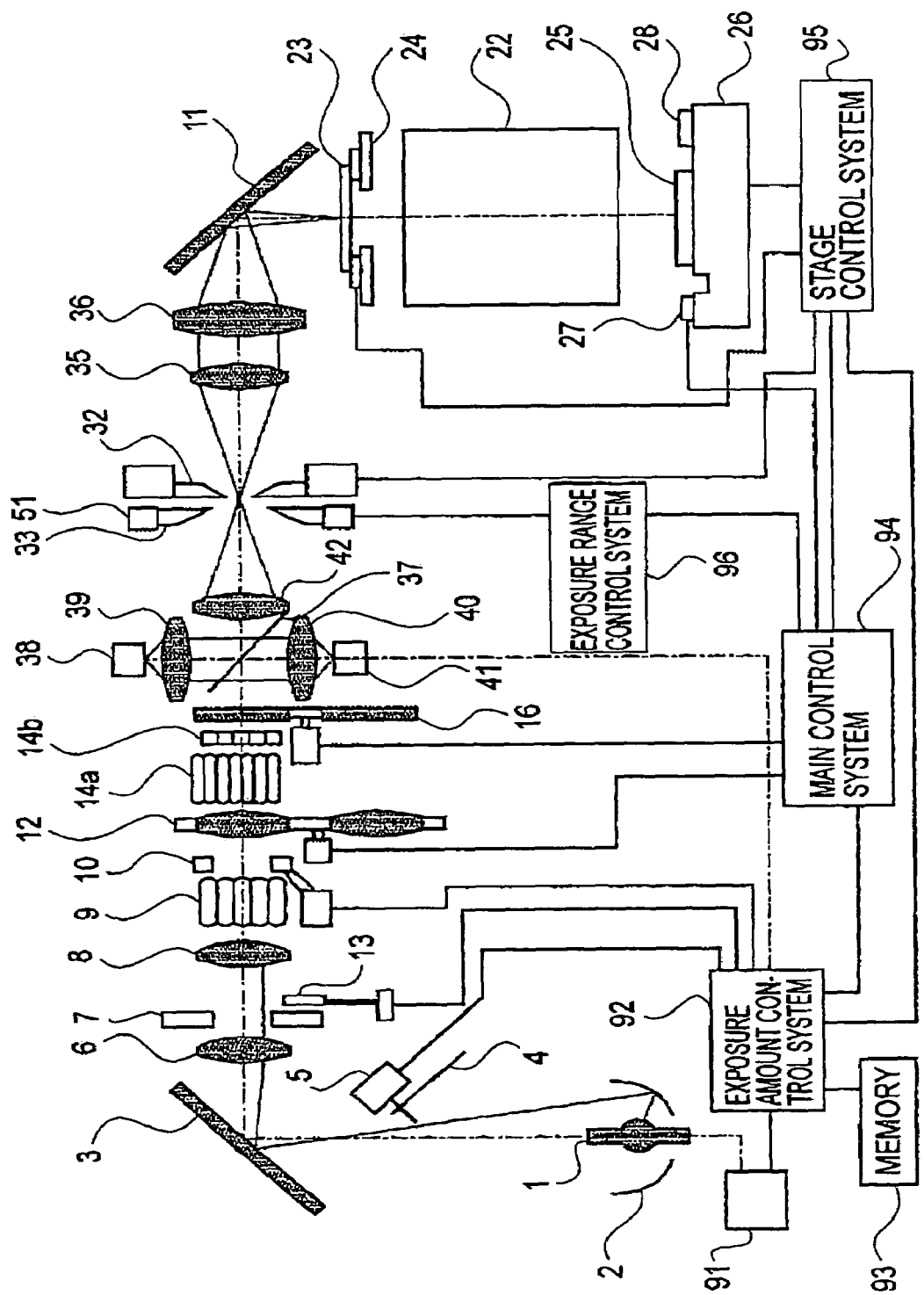
FIG. 7 is a schematic and diagrammatic view for explaining the structure of a projection exposure apparatus according to the first and second embodiments of the present invention.
Figure 10:
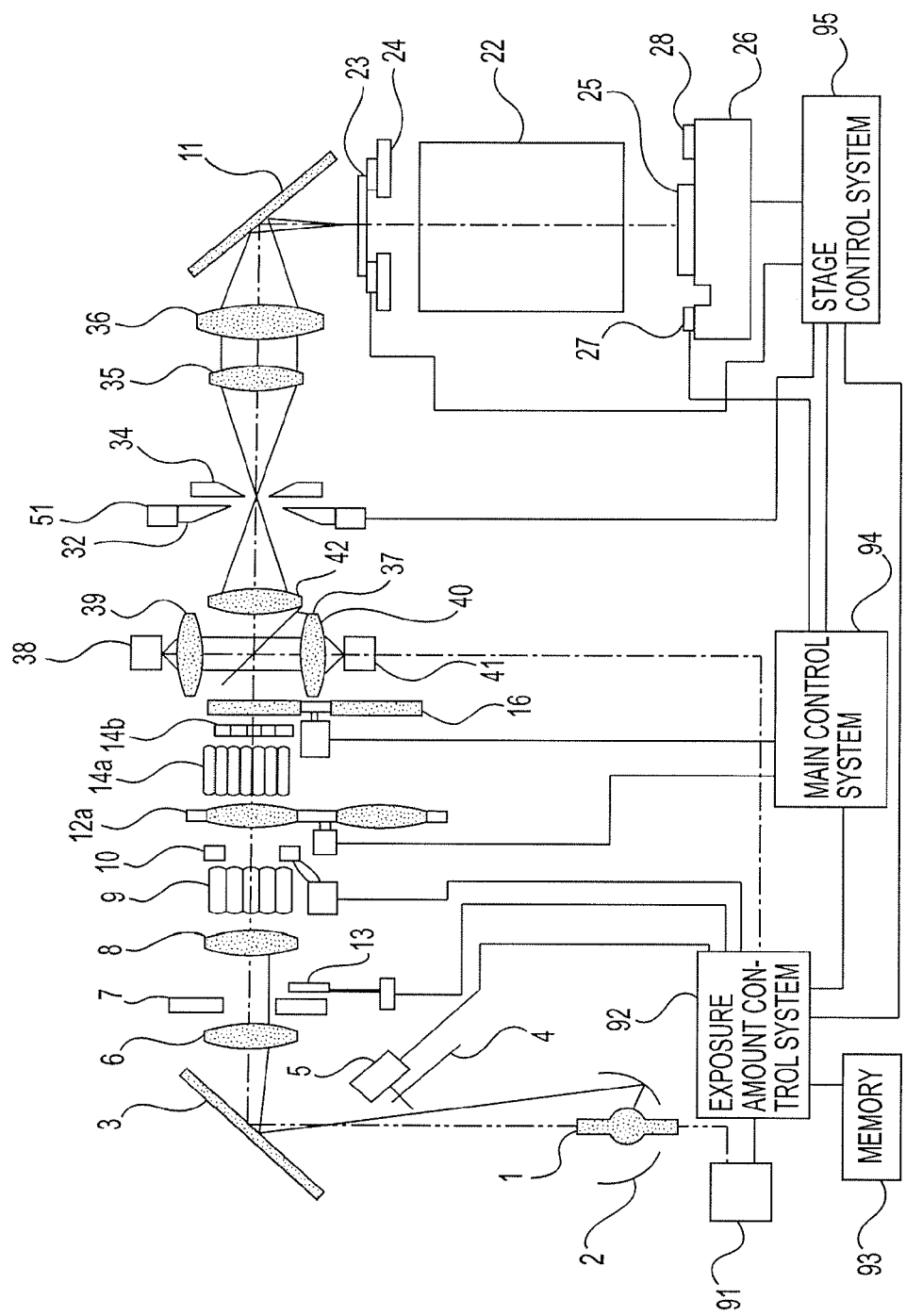
FIG. 10 is a schematic and diagrammatic view for explaining the structure of a conventional projection exposure apparatus.

A first embodiment of the present invention will be described with reference to the drawings. FIG. 7 shows the structure of a slit scan type projection exposure apparatus according to this embodiment. In FIG. 7, elements corresponding to those of FIG. 10 are denoted by like numerals. The control method for controlling the projection exposure apparatus using an exposure non-uniformness adjusting plate mechanism of this embodiment may be such as that described in detail in Japanese Laid-Open Patent Application, Publication No. 2001-244183, and a description thereof will be omitted here.

Figure 1:
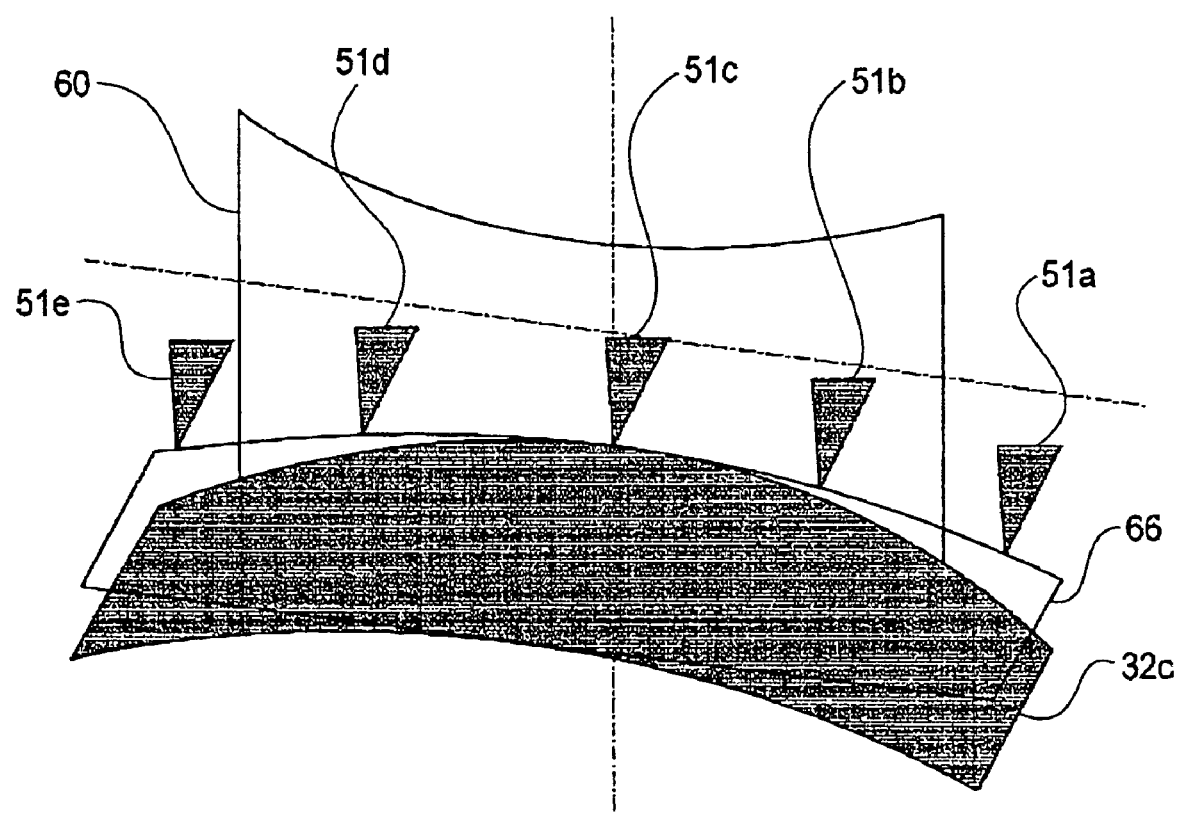
FIG. 1 is a schematic view for explaining a structure for providing an opening shape adjusting function to exposure region shaping means according to a first embodiment of the present invention.
Figure 2A:
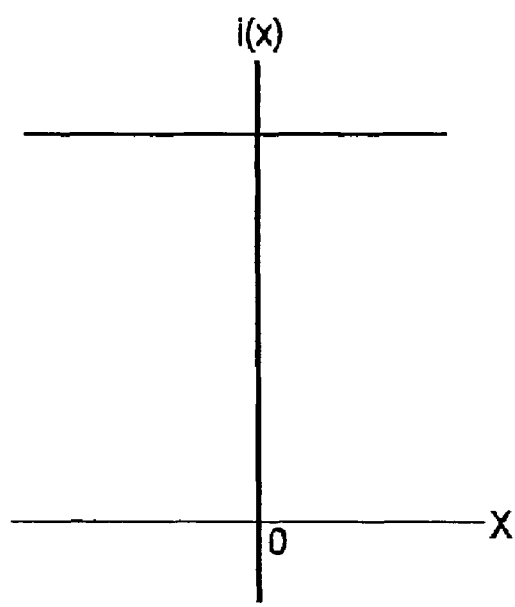
FIGS. 2A and 2B are graphs for explaining a difference between an illuminance distribution on a mask (original) and an illuminance distribution on a wafer (photosensitive substrate).
Figure 2B:
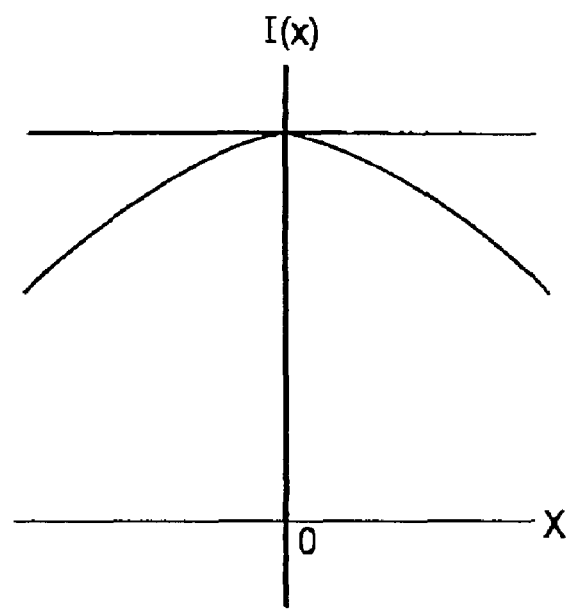
Figure 3:
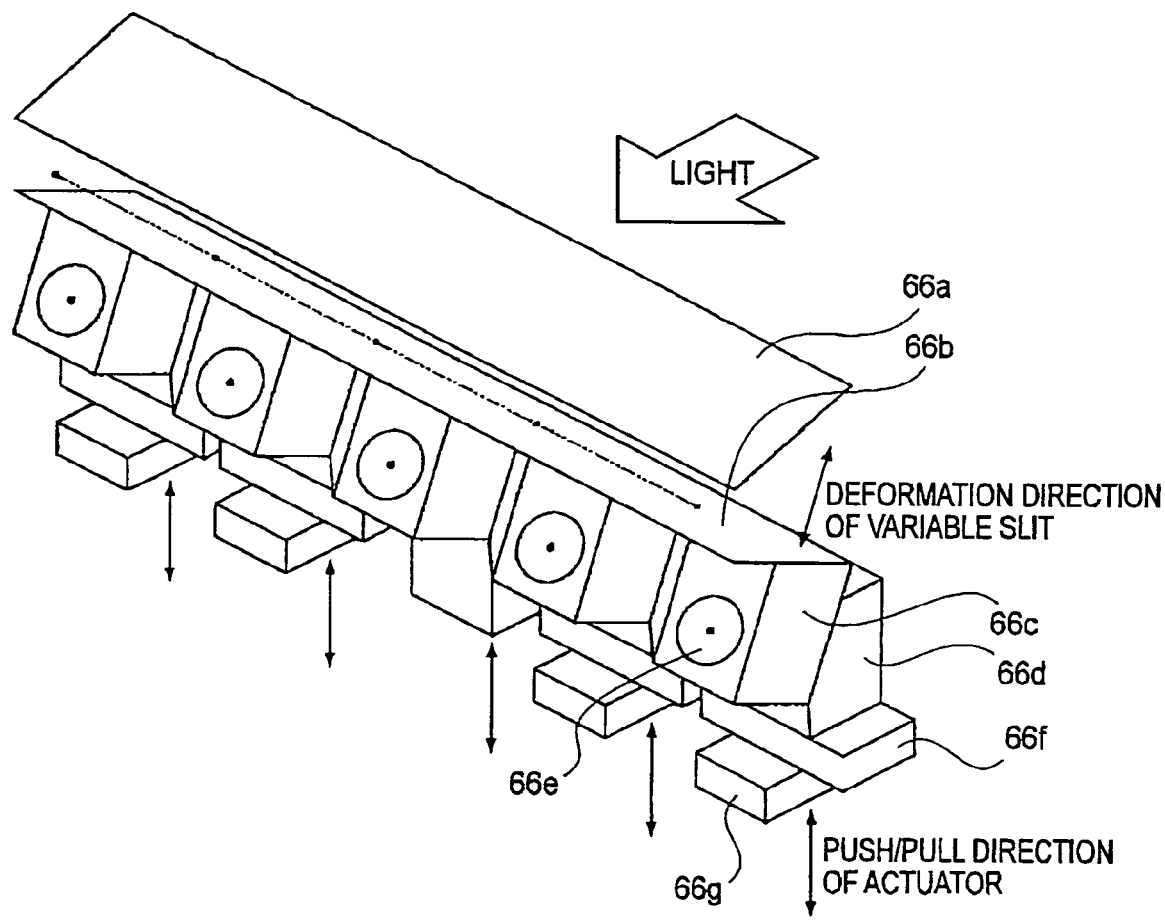
FIG. 3 is a schematic view for explaining the structure of an exposure non-uniformness adjusting plate mechanism, according to the first embodiment of the present invention.

FIG. 3 best shows the feature of the present invention. In FIG. 3, denoted at 66a is a fixed plate, and denoted at 66b is a variable plate that comprises a thin metal plate, constituting exposure non-uniformness adjusting means. The variable plate may be provided by any other member, as long as it is resiliently deformable. Denoted at 66c is a block mounted locally along the slit direction of the variable plate, and denoted at 66d is a block seat. Denoted at 66e is a pivotal motion guiding mechanism, and denoted at 66f and 66g are plane guiding mechanisms each having mutually orthogonal straight-motion guiding mechanisms. If the plane guiding mechanism is provided on a driving axis at the central portion, the in-plane position of the variable plate cannot be fixed any more. Therefore, the plane guiding mechanism is not provided to such a central driving axis.

The forces to be applied to the variable plate (thin metal plate) from a plurality of driving axes are those in the upward and downward directions as viewed in FIG. 3, namely, in the directions substantially perpendicular to the optical axis of the illumination optical system (i.e., the widthwise direction of the slit defined by the illumination optical system, and the direction corresponding to the scan direction upon the mask or wafer). However, as long as the plural driving axes apply a force (displacement) to the variable plate in the same direction, a structure being arranged to apply, to the variable plate, a force in a direction inclined with respect to the optical axis of the illumination optical system, may be used.

In this example, the driving axis at the center is not provided with a plane guiding mechanism, but it is provided with a pivotal motion guiding mechanism. However, the pivotal motion guiding mechanism for the central driving axis may be omitted. Namely, it is possible that neither the plane guiding mechanism nor the pivotal motion guiding mechanism is provided to the driving axis at the central portion, and the structure may be arranged so that the position of the central portion of the thin metal plate of the variable plate, as well as the tilt with respect to the illumination optical system, are determined by the central driving axis.

As a matter of course, the driving axis having no plane guiding mechanism, such as described above, may not be a central axis. It may be any one of plural driving axes that function to push or pull the variable plate in the scan direction (scan direction upon the reticle or width direction of the slit upon the reticle). On the other hand, in this embodiment, one pivotal motion guiding mechanism and two plane guiding mechanisms are provided in relation to a single driving axis. However, the two plane guiding mechanisms are provided in relation to a single driving axis. However, the two plane guiding mechanisms may be replaced by a single two-dimensional guiding mechanism. Alternatively, in place of one pivotal motion guiding mechanism and one plane guiding mechanism, a guiding mechanism (e.g., leaf springs) for confinement in a plane, may be used.

In the structure described above, when plural actuators cause pushing or pulling motion, the variable plate 66 is flexed and it is deformed in the thickness direction of the plate. At this time, the pivotal motion guiding mechanism 66e and the plane guiding mechanism 66f and 66g are moved, whereby the stress unnecessary for the variable slit deformation is dissipated into these guiding mechanisms. As a result, the load to the actuators is suppressed to a minimum. Also, the risk of plastic deformation of the thin metal plate, constituting the variable plate 66b, is reduced considerably.

Figure 8A:
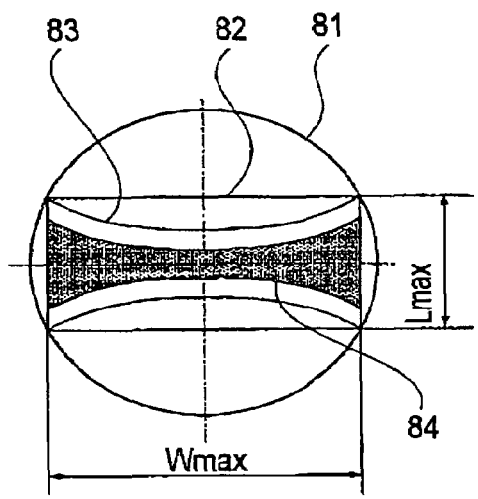
FIGS. 8A and 8B are schematic views for explaining an effective range of a projection lens.

This embodiment uses an approximately parallel largest opening area 83 (FIG. 8A) positioned inside the rectangular exposure area 82. The opening area 84 depicts the initial shape of the opening.

In accordance with the functions described hereinbefore, by changing the opening width of the exposure non-uniformness adjusting slit locally within the range of the largest opening area 83 on the basis of the illuminance non-uniformness upon the wafer surface, the integrated exposure amount on the wafer surface as the slit scan exposure is carried out can be held to be substantially uniform.

Here, the integrated exposure amount on the wafer 25 surface is measured by use of an illuminance non-uniformness sensor (light quantity sensor) 27, which is provided on the wafer stage that carries thereon a wafer (or a member being movable while carrying a wafer thereon). In response to the measurement, a main control system 9 controls the pushing and pulling motion of the actuators, whereby the slit width is adjusted at plural locations in the slit lengthwise direction (slit direction). Here, the measurement of the light quantity on the wafer using the illuminance non-uniformness sensor may be carried out every time the wafer is singly exposed in the scan directions, every time the wafer is exposed reciprocally in the scan direction, every time the wafer as a whole is exposed, every time wafers of a single lot are exposed, or every time any printing disorder of the wafer is found.

Further, the slit may be substantially closed, if necessary.

The exposure region shaping means, that is, the variable plate of the exposure non-uniformness adjusting slit mechanism, is made by a thin metal plate having resilience. It is disposed at the center of the edge of the thin metal plate, and at a position rotationally tilted about the slit direction as a rotational axis.

The movement direction of the mechanism for pushing and pulling this variable plate is in the scan direction. Thus, this mechanism does not interfere with the blind mechanism described hereinbefore. The deformation direction of the variable plate is parallel to the thickness direction of the thin metal plate, constituting the slit.

In order to convert the movement direction of the mechanism for pushing and pulling the variable plate, into the deformation direction of the variable plate, members attached to plural locations on the thin metal plate may preferably be provided with a pivotal motion guiding mechanism having rotational axes taken on the slit direction and a direction perpendicular to the deformation direction of the variable plate. Furthermore, a pushing/pulling mechanism at the center may desirably be provided with such a pivotal motion guiding mechanism only, while the remaining pushing/pulling mechanisms may be provided with a plane guiding mechanism, as well as a pivotal motion mechanism.

The exposure non-uniformness adjusting slit mechanism described above is applicable both to a case wherein the shape of the slit opening is approximately parallel, and to a case wherein it is arcuate. Furthermore, in the exposure non-uniformness adjusting slit mechanism described above, even if excessive stress is produced on the thin metal plate that constitutes the variable plate, through the movements of the pivotal motion guiding mechanism and the plane guiding mechanism, the stress unnecessary for the deformation of the variable plate is dissipated into these guiding mechanisms. Therefore, the load to the actuators is suppressed to a minimum. Also, the risk of plastic deformation of the thin metal plate, constituting the variable plate, is reduced considerably.

Embodiment 2

The second embodiment differs from the first embodiment in that, although the first embodiment uses an approximately parallel slit, in the second embodiment, the exposure non-uniformness adjusting slit mechanism is applied to locally change the opening width of the arcuate slit in a catadioptric projection system. Those portions of the second embodiment not particularly described have a similar structure as those of the first embodiment.

In the second embodiment, an arcuate slit is produced by adapting a thin metal plate to follow the surface of an elliptical cylinder and by slicing the whole plate obliquely with respect to the axis of the elliptical cylinder. Through this process, the thin metal plate can have can edge of an arcuate shape.

Figure 4:
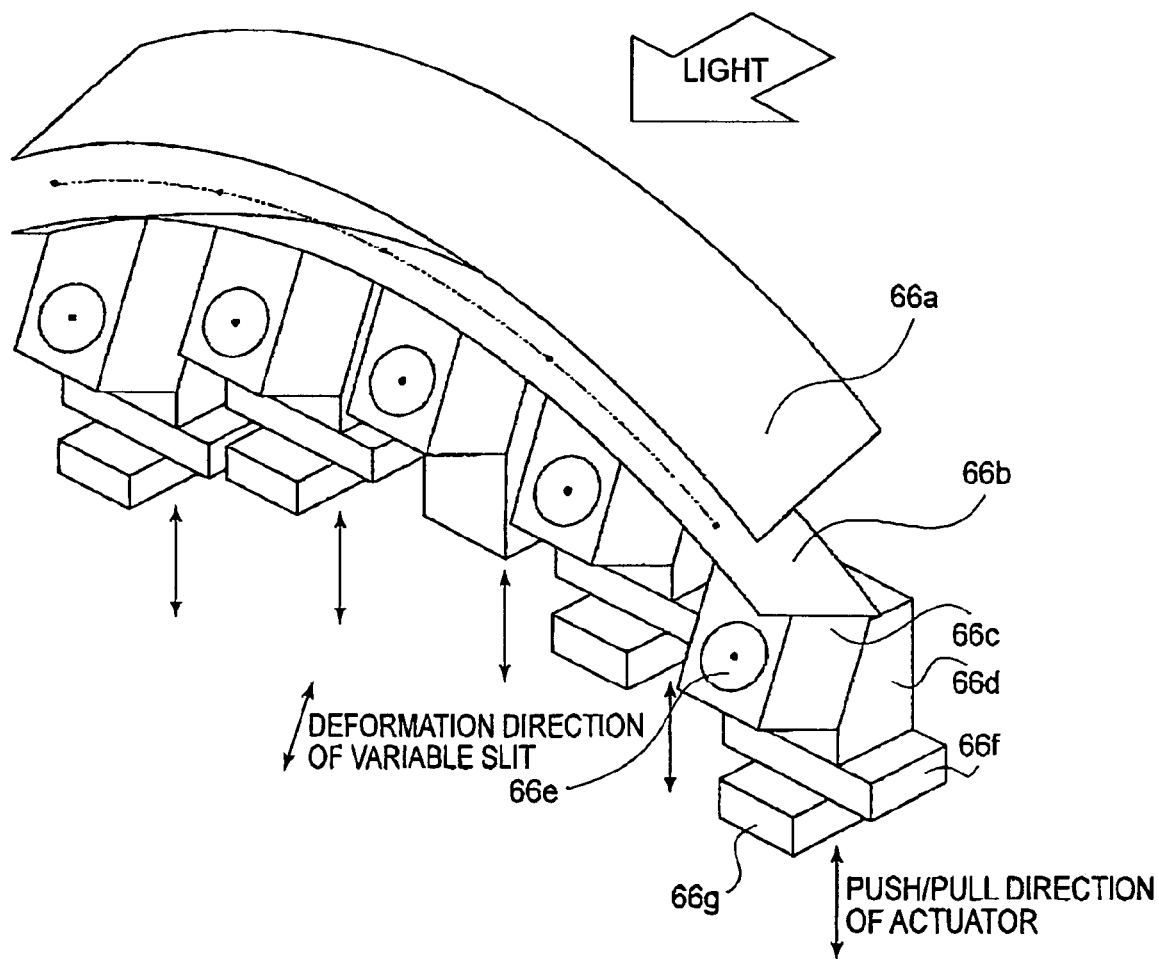
FIG. 4 is a schematic view for explaining the structure of an exposure non-uniformness adjusting plate mechanism, according to a second embodiment of the present invention.
Figure 5:
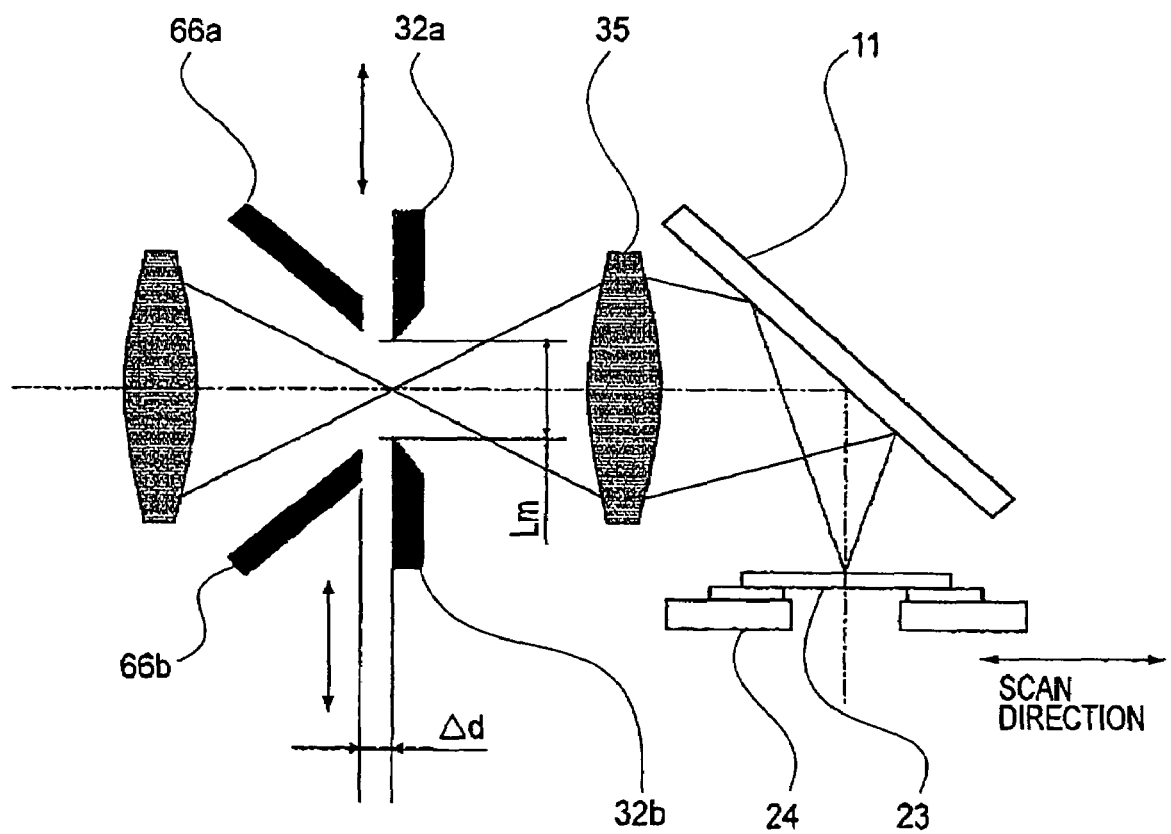
FIG. 5 is a schematic view for explaining an arrangement of a main portion of a projection exposure apparatus, according to the first and second embodiments of the present invention.
Figure 6A:
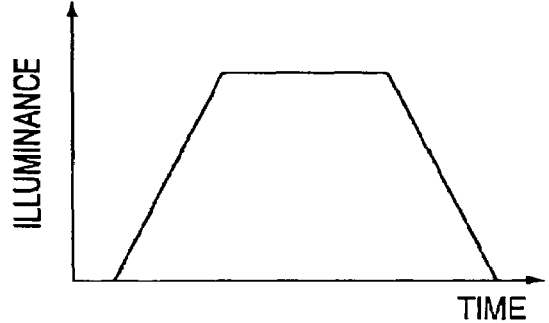
FIGS. 6A and 6B are graphs for explaining an intensity distribution of exposure light, upon a wafer.
Figure 6B:
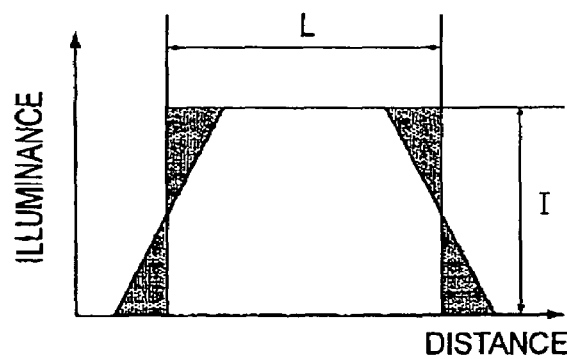

FIG. 4 best shows the feature of the present invention. In FIG. 4, denoted at 66a is a fixed plate defining member, and denoted at 66b is a variable plate defining member that comprises a thin metal plate, constituting exposure non-uniformness adjusting means. Denoted at 66c is a block mounted locally along the slit direction of the variable plate, and denoted at 66d is a block seat. Denoted at 66e is a pivotal motion guiding mechanism, and denoted at 66f and 66g are plane guiding mechanisms each having mutually orthogonal straight-motion guiding mechanisms. If the plane guiding mechanism is provided on a driving axis at the central portion, the in-plane position of the variable plate cannot be fixed any more. Therefore, the plane guiding mechanism is not provided to such a central driving axis.

In this example, the driving axis at the center is not provided with a plane guiding mechanism, but it is provided with a pivotal motion guiding mechanism. However, the pivotal motion guiding mechanism for the central driving axis may be omitted. Namely, it is possible that neither the plane guiding mechanism nor the pivotal motion guiding mechanism is provided to the driving axis at the central portion, and the structure may be arranged so that the position of the central portion of the thin metal plate of the variable plate, as well as the tilt with respect to the optical axis of the illumination optical system, are determined by the central driving axis.

As a matter of course, the driving axis having no plane guiding mechanism, such as described above, may not be a central axis. It may be any one of plural driving axes that function to push or pull the variable plate in the scan direction (scan direction upon the reticle or width direction of the slit upon the reticle). On the other hand, in this embodiment, one pivotal motion guiding mechanism and two plane guiding mechanisms are provided in relation to a single two-dimensional guiding mechanism. Alternatively, in place of one pivotal motion guiding mechanism and one plane guiding mechanism, a guiding mechanism (e.g., leaf springs), for confinement in a plane, may be used.

In the structure described above, when plural actuators cause pushing or pulling motion, the variable plate 66 is flexed and it is deformed in the thickness direction of the plate. At this time, the pivotal motion guiding mechanism 66e and the plane guiding mechanisms 66f and 66g are moved, whereby the stress unnecessary for the variable plate deformation is dissipated into these guiding mechanisms. As a result, the load to the actuators is suppressed to a minimum. Also, the risk of plastic deformation of the thin metal plate, constituting the variable plate 66b, is reduced considerably.

Figure 8B:
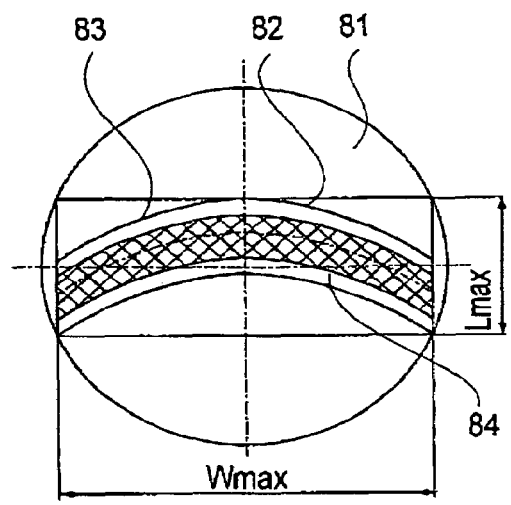
Figure 9:
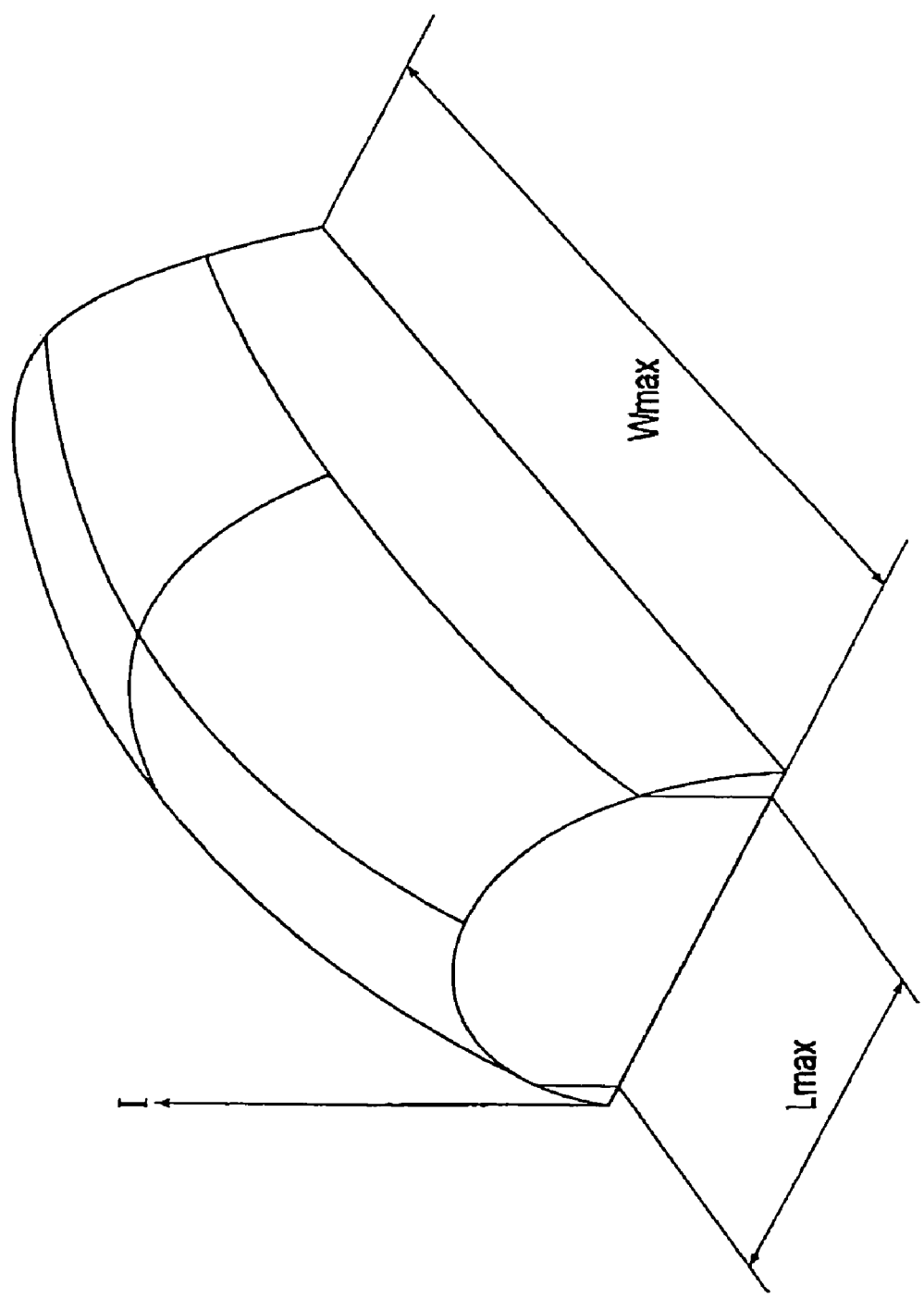
FIG. 9 is a schematic view for explaining an illumination distribution inside a rectangular exposure region.

FIG. 8B shows an effective region of the projection lens 22, upon the wafer 25 surface. Since, generally, a projection lens comprises a combination of optical elements having a circular outer periphery, the lens itself has a circular effective portion 81. However, as described hereinbefore, in slit scan type exposure apparatuses, in order to assure a scan exposure with a large width, a rectangular exposure area 82 inside the lens effective portion 81 is used. In this embodiment, a catadioptric system having a plurality of mirrors and lenses is chosen as a projection optical system, from the standpoint of energy efficiency, chromatic aberration, and environment sensitivity, and it is applied to a scanning projection exposure apparatus having an arcuate-shape slit opening. Hence, an arcuate largest opening area 83 inside the rectangular exposure region 82 is used. The opening area 84 depicts the initial shape of the slit opening.

In accordance with the functions described hereinbefore, by changing the opening width of the exposure non-uniformness adjusting slit locally within the range of the largest opening area 83 on the basis of the illuminance non-uniformness upon the wafer surface, the integrated exposure amount on the wafer surface, as the slit scan exposure is carried out, can be held to be substantially uniform.

Here, the integrated exposure amount on the wafer 25 surface is measured by use of an illuminance non-uniformness sensor (light quantity sensor) 27, which is provided on the wafer stage that carries thereon a wafer (or a member being movable while carrying a wafer thereon). In response to the measurement, a main control system 9 controls the pushing and pulling motion of the actuators, whereby the slit width is adjusted at plural locations in the slit lengthwise direction (slit direction). Here, the measurement of the light quantity on the wafer using the illuminance non-uniformness sensor may be carried out every time the wafer is singly exposed in the scan direction, every time the wafer is exposed reciprocally in the scan direction, every time the wafer as a whole is exposed, every time wafers of a single lot are exposed, or every time any printing disorder of the wafer is found.

Further, the slit may be substantially closed, if necessary.

Embodiment 3

Next, an embodiment of a device manufacturing method, which uses a projection exposure apparatus described above, will be explained as a third embodiment of the present invention.

Figure 11:
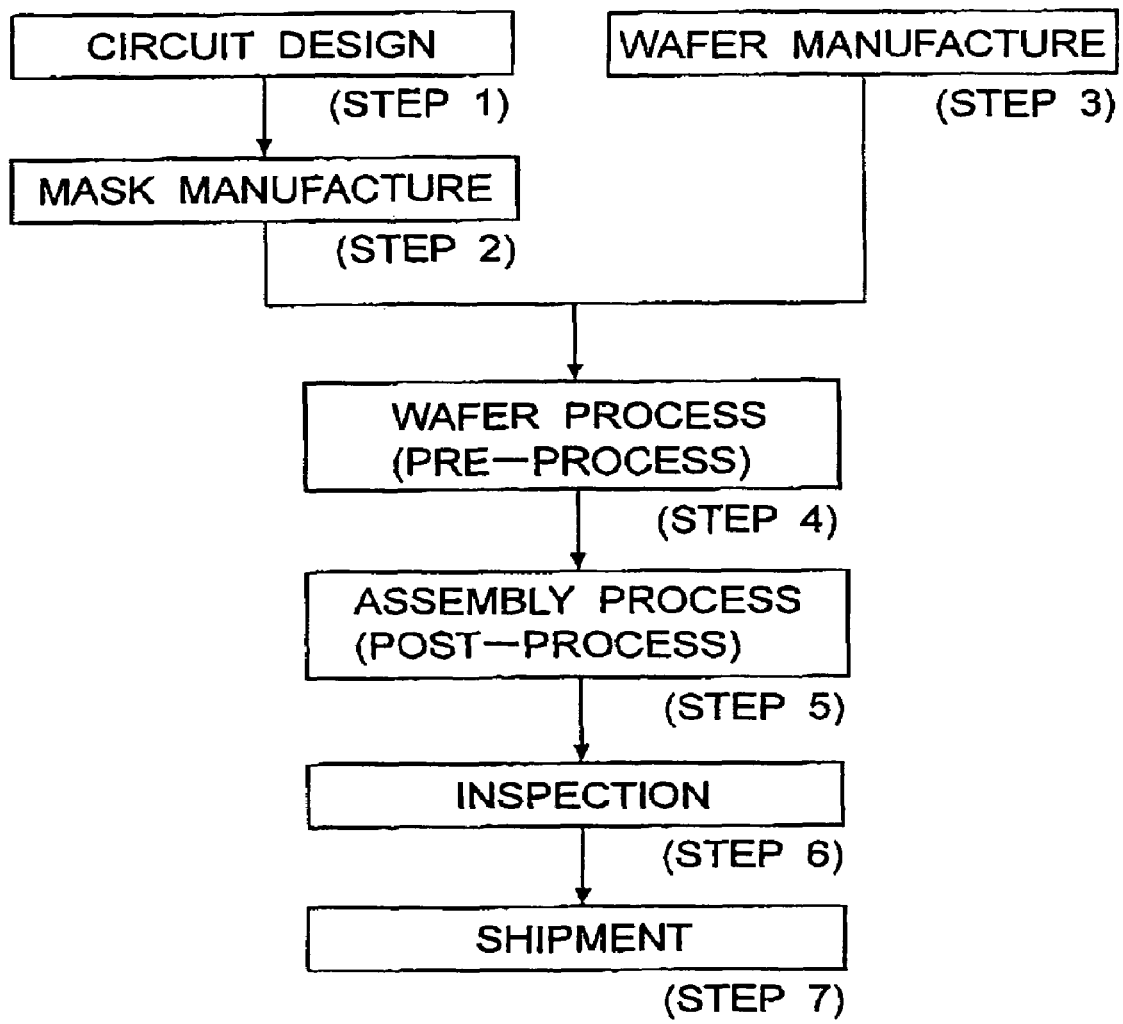
FIG. 11 is a flow chart for explaining the procedure of microdevice manufacturing processes.

FIG. 11 is a flow chart for explaining the procedure of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 12:
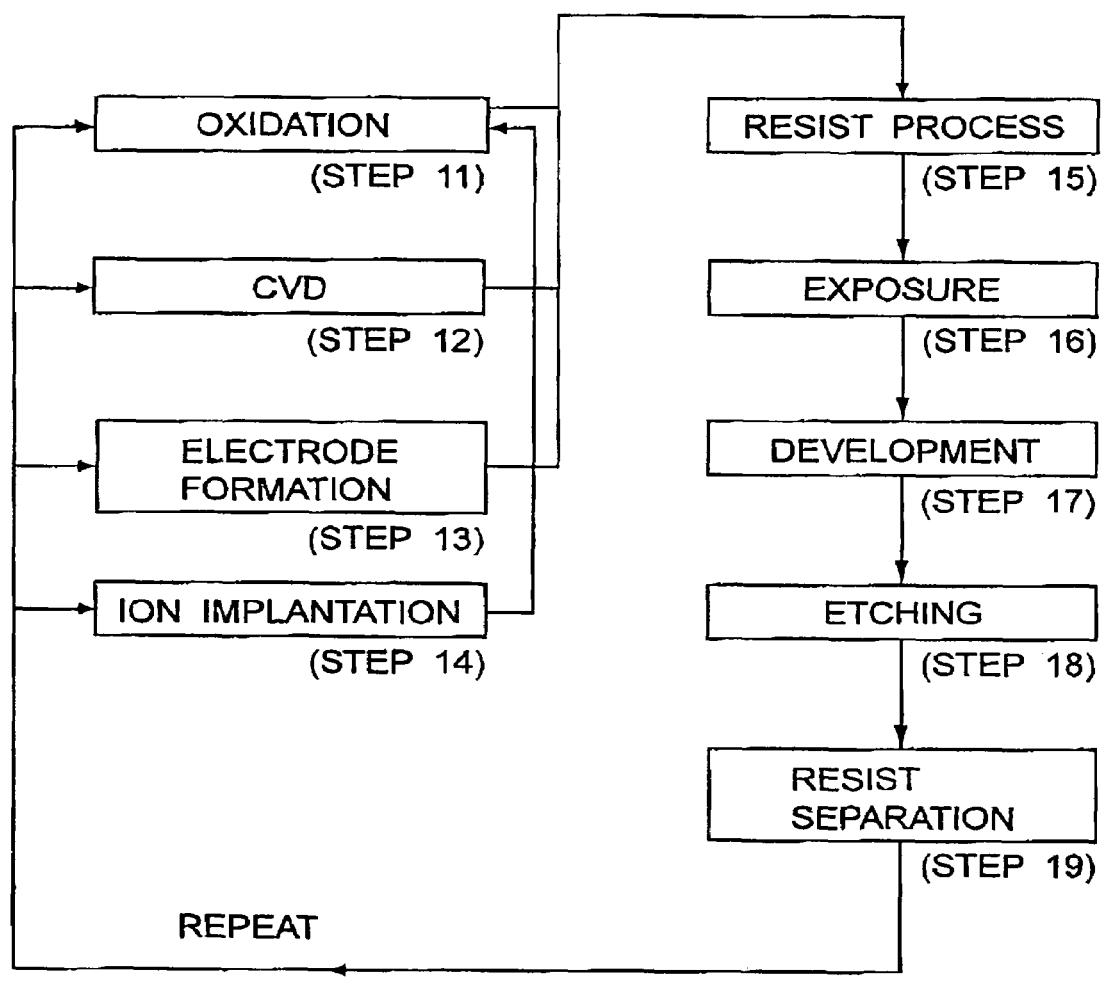
FIG. 12 is a flow chart for explaining details of a wafer process, included in the procedure shown in FIG. 11.

FIG. 12 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is a ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with a lower cost.

In accordance with the embodiments of the present invention as described hereinbefore, the exposure non-uniformness adjusting slit mechanism is applicable both to an approximately parallel slit and to an arcuate slit. Even if excessive stress is produced in the thin metal plate that constitutes the variable plate, through the movements of the pivotal motion guiding mechanism, and the plane guiding mechanism, the stress unnecessary for the deformation of the variable plate is dissipated into these guiding mechanisms. Therefore, the load to the actuators is suppressed to a minimum. Also, the risk of plastic deformation of the thin metal plate, constituting the variable plate, is reduced considerably.

Viewing the structure of a projection exposure apparatus, at a plane adjacent to the edge of the slit and being optically conjugate with a mask, a blind mechanism for restricting the irradiation region on a mask would be provided. However, since, in the embodiments of the present invention, the pushing/pulling mechanism is accommodated in a direction perpendicular to the optical axis direction and the slit direction, unwanted interference between the exposure non-uniformness adjusting slit mechanism and the blind mechanism can be avoided.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-434549, filed on Dec. 26, 2003, which is hereby incorporated by reference.

What is claimed is:

1. A scanning exposure apparatus, comprising:
an illumination optical system for illuminating a pattern of an original through an opening being conjugate or approximately conjugate with the pattern of the original; and
a changing mechanism for changing a width of the opening with respect to a scan direction of the original, said changing mechanism including a light blocking plate, and a plurality of driving mechanism for moving said light blocking plate, said plurality of driving mechanisms being provided at different positions with respect to said light blocking plate and also being arranged to be driven by an actuator,
wherein at least one of said plurality of driving mechanisms includes a guiding mechanism for allowing a deviation between a position of an object to be driven by said actuator and a position of said light blocking plate, with respect to a direction different from a direction of displacement of the object to be driven.

2. An apparatus according to claim 1, wherein said guiding mechanism includes at least one of a straight motion guiding mechanism, a rotational motion guiding mechanism, and an in-plane motion guiding mechanism.

3. An apparatus according to claim 1, wherein said guiding mechanism is arranged to allow a deviation in a plane substantially perpendicular to the displacement direction.

4. An apparatus according to claim 3, wherein all of said plurality of driving mechanisms, except one driving mechanism, have guiding mechanisms each being as aforesaid.

5. An apparatus according to claim 1, wherein said guiding mechanism is arranged to allow a deviation in a rotational direction along a plane substantially perpendicular to an optical axis of said illumination optical system.

6. An apparatus according to claim 1, wherein said light blocking plate is inclined with respect to an optical axis of said illumination optical system.

7. An apparatus according to claim 1, wherein said plurality of driving mechanisms are arranged to move said light blocking plate in a predetermined direction along a plane substantially perpendicular to an optical axis of said illumination optical system.

8. An apparatus according to claim 1, wherein the opening has an arcuate shape.

9. An apparatus according to claim 1, further comprising a projection optical system for projecting the pattern of the original as illuminated by said illumination optical system, onto a substrate.

10. An apparatus according to claim 9, further comprising an original stage for carrying thereon the original and for scanningly moving the same, and a substrate stage for carrying thereon the substrate and for scanningly moving the same.

11. An apparatus according to claim 10, further comprising a sensor for measuring an exposure amount upon said substrate stage, and a control system for adjusting the width of the opening through said changing mechanism and on the basis of the measurement by said sensor.

12. An apparatus according to claim 9, wherein a largest width of the opening is a value not greater than a width corresponding to an allowable largest view angle of said projection optical system with respect to the scan direction.

13. An apparatus according to claim 1, wherein said light blocking plate includes a flexible metal plate.

14. An apparatus according to claim 1, wherein the displacement direction is substantially parallel to the scan direction.

15. A device manufacturing method, comprising the steps of:
transferring a pattern of an original onto a substrate by use of a scanning exposure apparatus as recited in claim 1; and
developing the substrate having the pattern transferred thereto.

* * * * *

UNITED STATES PATENT AND TRADEMARK OFFICE
CERTIFICATE OF CORRECTION

PATENT NO. : 7,148,948 B2  Page 1 of 1
APPLICATION NO. : 11/019106
DATED : December 12, 2006
INVENTOR(S) : Kazuo Sano It is certified that error appears in the above-identified patent and that said Letters Patent is hereby corrected as shown below:

ON THE TITLE PAGE:
In item "(30) Foreign Application Priority Data," the listed document "Dec. 26, 2003   (JP) ................. 2003-434549" should read as follows:

-- Dec. 26, 2003   (JP) .................... 2003-434549 --.

TITLE PAGE
In item "(57) ABSTRACT," line 7, "plat" should read -- plate --.

COLUMN 1:
Line 28, "minor" should read -- mirror -.

COLUMN 4:
Line 65, "0.10 µm/sec" should read -- 0.10 m/sec --.

COLUMN 5:
Line 49, "plat" should read -- plate --.

COLUMN 13:
Line 67, "mechanism" should read -- mechanisms --.

Signed and Sealed this

Tenth Day of April, 2007

JON W. DUDAS
*Director of the United States Patent and Trademark Office*